(12) United States Patent
Tinsley

(10) Patent No.: US 6,686,744 B1
(45) Date of Patent: Feb. 3, 2004

(54) ADAPTER FOR USE IN MEASURING ELECTRICAL CURRENT DRAWN ACROSS A FUSE IN A CIRCUIT

(75) Inventor: William Tinsley, Atlanta, GA (US)

(73) Assignee: BellSouth Intellectual Property Corporation, Wilmington, DE (US)

(*) Notice: Subject to any disclaimer, the term of this patent is extended or adjusted under 35 U.S.C. 154(b) by 6 days.

(21) Appl. No.: 10/097,572

(22) Filed: Mar. 15, 2002

(51) Int. Cl.$^7$ .......................... G01R 31/07; H01H 85/30
(52) U.S. Cl. ........................ 324/507; 324/550
(58) Field of Search ................. 324/507, 550, 324/126, 149, 537; 340/638; 337/241, 242, 206; 439/621, 692

(56) References Cited

U.S. PATENT DOCUMENTS

| | | | | |
|---|---|---|---|---|
| 4,281,888 A | * | 8/1981 | Seaman | 439/692 |
| 4,602,216 A | * | 7/1986 | Keel | 324/126 |
| 4,691,197 A | * | 9/1987 | Damiano et al. | 340/638 |
| 6,429,663 B1 | * | 8/2002 | LaCoste | 324/550 |

* cited by examiner

Primary Examiner—Anjan K. Deb
(74) Attorney, Agent, or Firm—Shaw Pittman LLP

(57) ABSTRACT

The present invention relates to an apparatus for use in measuring current drawn across a fuse socket in an electrical circuit. An exemplary embodiment of an apparatus according to the present invention is a fuse adapter that includes an outer shell that is specifically molded to fit within a corresponding fuse socket. The shell includes two contacts that electrically contact leads when inserted within the socket. The contacts also protrude through the inner surface of the fuse adapter. First and second electrically conductive paths, or wires, are connected to each contact on the inner surface of the adapter and extend outward from the base of the adapter to contact with leads of an ammeter to test the current across the fuse socket.

11 Claims, 3 Drawing Sheets

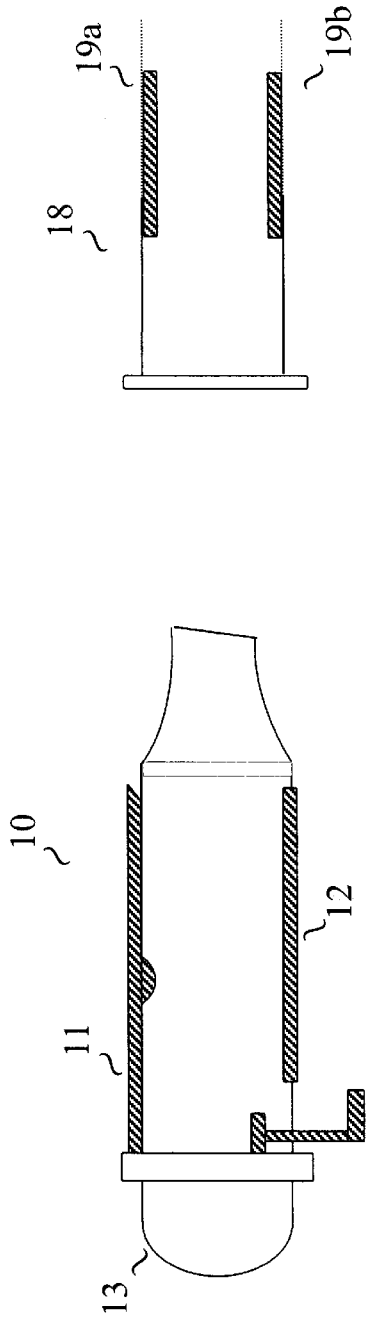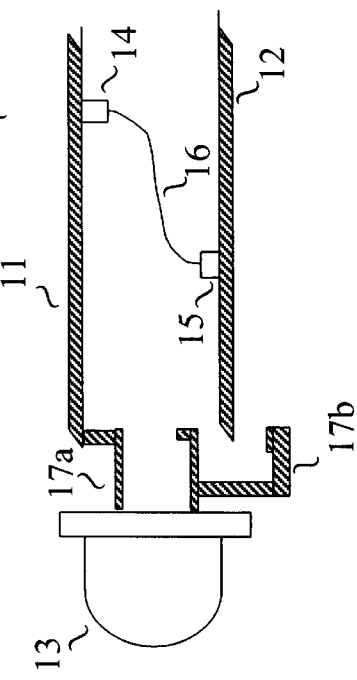
FIGURE 1A
FIGURE 1B

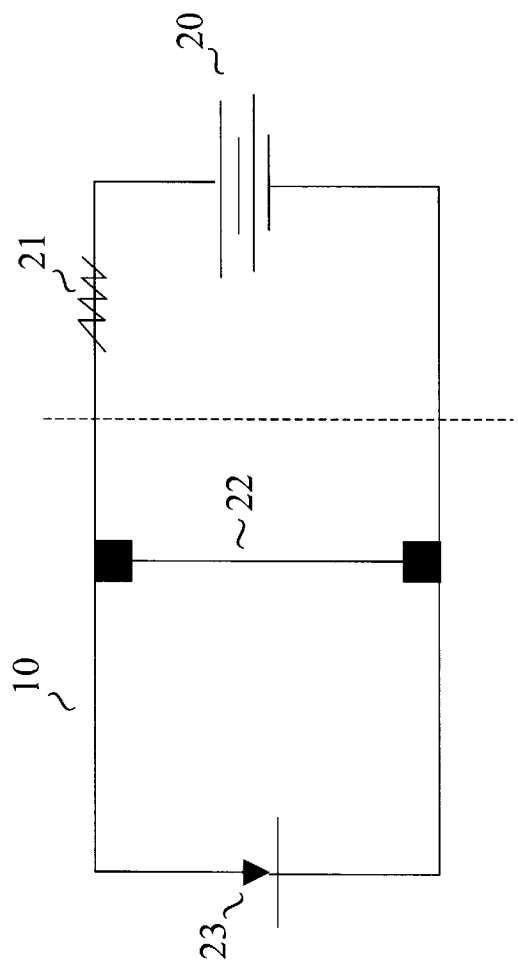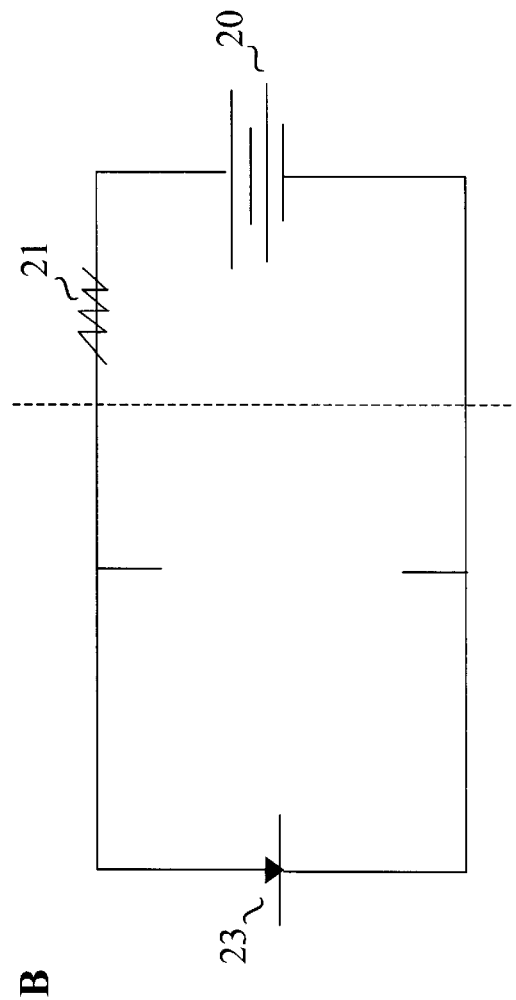
FIGURE 2A
FIGURE 2B

ADAPTER FOR USE IN MEASURING ELECTRICAL CURRENT DRAWN ACROSS A FUSE IN A CIRCUIT

BACKGROUND OF THE INVENTION

1. Field of the Invention

The present invention relates to electrical circuits that include an electrical fuse, and more particularly, to an apparatus for evaluating the electrical fuse and for measuring the current that is drawn across the fuse in the electrical circuit.

2. Background Information

An electrical fuse is a device that is placed within an electrical circuit to disconnect the circuit if the current being drawn across the fuse exceeds a predetermined amount. A fuse is typically comprised of two leads that are connected by a thin conductive element, or filament. As the current that is drawn across the filament increases, the temperature of the element also rises. When the temperature increases beyond a predetermined threshold, the filament is "blown," thereby breaking the path between the two leads. Once a fuse is "blown," the circuit remains disconnected and inoperable until the fuse is removed and replaced.

Electrical fuses are commonly utilized in electrical circuits for a wide variety of applications to protect devices or appliances that draw electrical power within the circuit. If the current drawn across the fuse exceeds its rated amount, the fuse disconnects the circuit so that the corresponding device or appliance that is connected in the circuit no longer draws power. This protects the device or appliance from being overloaded, which could cause damage to either the device or the power source. The fuse is selected to have a rating below the maximum threshold for the device or appliance.

There are many reasons why a fuse may blow to disconnect an electrical circuit. As one example, a circuit may include one or more devices that have a varying load or resistance, which in turn creates variances in the amount of current flowing through the circuit. If too many devices are added to the circuit and draw too much current at one time (e.g., simultaneously operating headlamps, stereo, air conditioning, windshield wipers, and electric windows in a car), a fuse may blow to protect the devices from an overload. As another example, a fuse may also blow if the ambient temperature is too high, which adds to the heat experienced by the filament within the fuse. If a circuit is operating near peak capacity, an extreme ambient temperature may cause the filament to overheat and blow. In still another example, a fuse may blow upon experiencing a surge in the power supply (e.g., lightning) to protect the devices operating within the circuit.

In some instances, a fuse may blow even when the circuit and the power supply are operating correctly and within predetermined tolerances. Because fuses are designed to be inexpensive and disposable, it is often possible that a fuse may be defective. It is also possible that the filament within the fuse may break due to vibration or from other environmental conditions. Therefore, a blown fuse is not always an indicator of a problem within the circuit, and may be corrected simply by replacing the fuse.

Fuses are typically designed to indicate when the filament is broken and the fuse is "blown." Many fuses are designed with a clear or translucent area covering the filament, which enables a technician to determine if the filament has ruptured after removing the fuse from a socket within the circuit. If an application requires hundreds of fuses, however, it is preferable to use fuses that provide an indication of whether they are in operation without having to disconnect the circuits. For such applications, fuses are available that include a light emitting diode (LED) that activates once the fuse is blown. In this manner, for example, a technician can immediately assess the condition of several hundred fuses in an equipment rack without having to interfere with the operation of the circuits.

When a technician detects that a fuse is blown (either by removing the fuse from a socket or noting that an LED is lit on a fuse board), the circuit should be tested to determine whether the problem was caused by a defective fuse or by other elements within the circuit. Depending upon the size and shape of the fuse and the fuse socket, the circuit can be tested by placing leads to an ammeter against the electrical contacts within the fuse socket. This will temporarily re-connect the circuit to enable a technician to measure the current flowing through the circuit. If the current is less than the rated value for the fuse, then it will be known that the fuse is defective. If the current has risen above the rated value for the fuse, then there may be problems with either the power supply or the load on the circuit, which should be corrected before the fuse is replaced.

In many applications, the sockets in fuse panels are too small or narrow to enable a technician to connect leads of an ammeter to the electrical contacts in the socket. As an example, the fuses that are used within a Central Office in a telecommunications facility are grouped together on a fuse panel that regulates many circuits in an equipment rack (fourteen on a board and approximately three hundred in a rack). To test these circuits, a technician must disconnect the entire fuse panel, thereby disabling several hundred circuits. If a circuit board in a telecommunications facility is disabled, hundreds of calls may be disconnected, resulting in a telephone service interruption. If fuses are blown for different reasons within a Central Office on a regular basis, the disabling of the corresponding circuit boards can result in a significant service failure.

In view of the foregoing, it can be appreciated that a substantial need exists for a method and apparatus that enables a technician to test a circuit without disabling an entire fuse panel, when the fuse sockets in the fuse panel are too small to receive leads to an ammeter.

SUMMARY OF THE INVENTION

The present invention relates to an apparatus for use in measuring current drawn across a fuse socket in an electrical circuit. An exemplary embodiment of an apparatus according to the present invention is a fuse adapter that includes an outer shell that is specifically molded to fit within a corresponding fuse socket. The shell includes two contacts that electrically contact leads when inserted within the socket. The contacts also protrude through the inner surface of the fuse adapter. First and second electrically conductive paths, or wires, are connected to each contact on the inner surface of the adapter and extend outward from the base of the adapter to contact with leads of an ammeter to test the current across the fuse socket.

In another exemplary embodiment, a fuse specifically designed for use in a particular fuse socket is modified by removing the filament and other materials within its inner surface, with the contacts that protrude through the inner surface of the fuse remaining. First and second electrically conductive paths are connected to each contact on the inner surface of the adapter and extend outward from the base of the adapter, to contact with leads of an ammeter when testing the current across the fuse socket.

It is an object of the present invention to provide an adapter for measuring current drawn across a fuse in a circuit when the shape of the fuse socket for receiving the fuse prevents direct contact between ammeter leads and conductive leads within the fuse socket. The adapter includes an adapter shell that is shaped to fit within a fuse socket. First and second electrical leads protrude from an outer surface of the shell, which are positioned to contact with first and second leads on an inner surface of the fuse socket, respectively. First and second wires are electrically connected to the respective first and second electrical leads and extend from the adapter shell to enable an electrical connection to leads of an ammeter.

Another object of the present invention is to provide an adapter for connecting leads of an ammeter to a fuse socket. An adapter shell is shaped to fit within a fuse socket. A first and second conductive means are included for contacting with first and second leads on an inner surface of the fuse socket, respectively. First and second connecting means are also included for connecting the conductive means to leads of an ammeter. Yet another object of the invention is to provide an adapter for connecting leads of an ammeter to a fuse socket in which first and second conductive means contacts both with first and second leads on an inner surface of the fuse socket and with leads of an ammeter.

Another object of the present invention is to provide a fuse adapter for use in testing an amount of current that is drawn across a fuse socket in an electrical circuit, wherein the fuse adapter is shaped to fit within a fuse socket and includes first and second conductors for connecting to contacts within the fuse socket and first and second connecting wires extending from the adapter to connect to an ammeter. The adapter is utilized to test current through a circuit by detecting that an electrical circuit is disconnected at a fuse, disconnecting the fuse from the fuse socket, connecting the fuse adapter to the fuse socket, and connecting the ammeter to the connecting wires. The amount of current drawn through the circuit is indicated by the ammeter.

Yet another object of the present invention is to provide a fuse adapter used for testing an amount of current that is drawn across a fuse socket in an electrical circuit, wherein the adapter is constructed by identifying a type of fuse specifically designed for use in the fuse socket, removing the filament from between two contacts within the fuse, and connecting wires to each contact within the fuse and extending the wires from the fuse to be connected to leads of an ammeter.

BRIEF DESCRIPTION OF THE DRAWINGS

FIG. 1a is an illustration of a fuse that is commonly utilized in a fuse panel within a central office for a telecommunications facility.

FIG. 1b is an illustration of the electrical connections within the fuse illustrated in FIG. 1a.

FIG. 2a is a schematic diagram of the fuse of FIG. 1a electrically connected within an electrical circuit.

FIG. 2b is a schematic diagram of fuse of FIG. 1a electrically connected within an electrical circuit after the fuse is blown.

DETAILED DESCRIPTION OF THE INVENTION

Figure 3A:
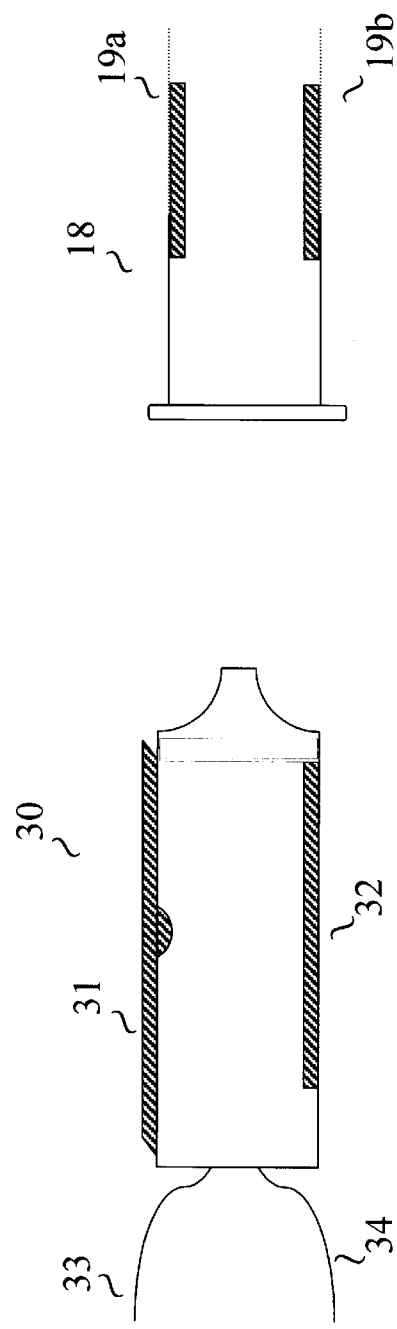
FIG. 3a is an illustration of a fuse adapter as an exemplary implementation of an embodiment of the invention.

The present invention is directed to a method and apparatus for enabling a technician to evaluate the electrical current that is drawn across a fuse socket in an electrical circuit. The method described herein is applicable for testing any circuit in which a fuse socket is of a size or shape that precludes a technician from directly contacting an ammeter to the socket. The invention is not limited to the adapter described in the preferred embodiment for use in a specific fuse socket, but relates more generally to an adapter design that extends the electrical contacts within a fuse socket to enable a technician to connect an ammeter.

FIG. 1a is an illustration of a fuse that is commonly utilized in a fuse panel within a central office for a telecommunications facility. As an example, the fuse can be used in fuse boards that power optical switch input/output (OSWIO) circuit packs that are part of Lucent Technologies' DACS-IV 2000 product. As can be seen in FIG. 1a, the fuse 10 includes a first electrical contact 11 on an upper surface and a second electrical contact 12 on a lower surface thereof. When the fuse is inserted into a fuse socket 18, the first and second contacts each form an electrical connection with leads 19a and 19b within the socket. The fuse 10 also includes a light emitting diode (LED) 13 that is activated if the fuse is blown.

FIG. 1b is an illustration of the electrical connections within fuse 10. As can be seen, the first electrical contact 11 extends downward beneath the outer surface of the shell at point 14, and the second electrical contact 12 extends upwards beneath the outer surface at point 15. Filament 16 connects the first and second electrical contacts. LED 13 is connected to the first contact through lead 17a and is connected to ground through lead 17b to common circuit ground (through the bayonet lug).

FIG. 2a is a schematic diagram of fuse 10 electrically connected within an electrical circuit. Power supply 20 provides electrical energy to operate a device represented by resistor 21. The resistor is connected in series with fuse 10, which in turn is connected to filament 22 and LED 23, arranged in parallel. When the fuse is in operation (not "blown"), all current flows through filament 22 (as a short circuit to LED 23), leaving LED 23 unlit. However, as shown in FIG. 2b, if the current across filament 22 increases beyond a certain threshold, the filament will break, leaving power supply 20 connected only to LED 23. More particularly, when the filament breaks, the ground rises in voltage and the current runs through the first electrical contact 11, LED 13, and lead 17b to the circuit ground.

FIG. 3a is an illustration of a fuse adapter 30 as an exemplary implementation of an embodiment of the invention, which is sized to be connectable to fuse socket 18. The fuse adapter includes first and second leads 31 and 32, which are of a size and shape to contact with leads 19a and 19b in the fuse socket 18. The outer surface of fuse adapter 30 is shaped to fit within fuse socket 18. Wires 33 and 34 extend from the base of the adapter to provide means for connecting fuse adapter 30 to an ammeter 35 (shown in FIG. 3b).

Figure 3B:
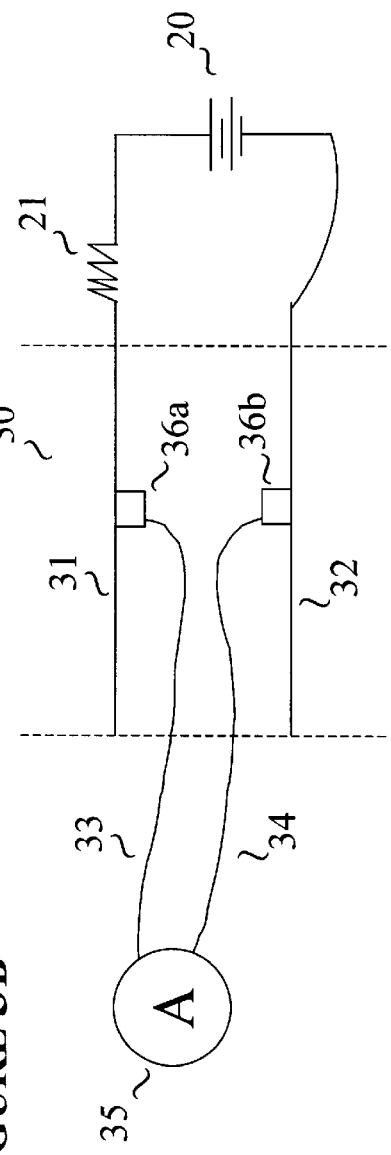
FIG. 3b is a schematic diagram illustrating the electrical connections between the fuse adapter of FIG. 3a and an ammeter, a fuse adapter, a power supply and a device within a circuit.

FIG. 3b is a schematic diagram illustrating the electrical connections between ammeter 35, fuse adapter 30, and power supply 20 and resistor 21 within the circuit. Leads 31 and 32 are each respectively connected to internal connectors 36a and 36b, which are in turn connected to wires 33 and 34. Upon connecting leads 31 and 32 of fuse adapter 30 to the fuse socket 18, and connecting wires 33 and 34 to ammeter 35, the circuit is closed. The ammeter measures the current across the fuse socket to enable a technician to evaluate the circuit.

The fuse adapter may be constructed in any dimensions that will fit within the electrical fuse socket, as long as an electrical connection may be formed between the external wires in the adapter and the electrical contacts in the fuse socket. Alternatively, a fuse adapter can be made from an existing fuse. This can be performed by extracting the filament and attaching wires to the two electrical contacts on the interior of the fuse.

The fuse adapter described with reference to FIGS. 3a and 3b can be used to evaluate a circuit when a fuse is blown and the shape of the corresponding fuse socket does not enable one to connect ammeter leads directly to the contacts in the socket. If the ammeter indicates that the current is lower than the rated value for the electrical fuse, then it is likely that the blown fuse was defective. If the current is higher than the rated value for the fuse, then there may be difficulties in the device or the power supply in the circuit.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. An adapter for measuring current drawn across a fuse in a circuit comprising:
   a) an adapter shell shaped to fit within a fuse socket;
   b) first and second electrical leads protruding from an outer surface of the shell, wherein the electrical leads are positioned to contact with first and second leads on an inner surface of the fuse socket, respectively; and
   c) first and second wires electrically connected to the respective first and second electrical leads and extending from an inner surface of the adapter shell to enable an electrical connection to leads of an ammeter.

2. The adapter of claim 1, further comprising first and second internal connectors on an inner surface of the adapter shell, wherein the connectors are electrically connected through the adapter shell to the respective first and second electrical leads, and are electrically connected to the respective first and second wires.

3. The adapter of claim 1, wherein the adapter shell is substantially cylindrical in shape.

4. The adapter of claim 2, wherein the adapter shell is shaped to fit within the fuse socket in substantially the same manner as the fuse designed for use in the fuse socket.

5. The adapter of claim 1, wherein the fuse is for use in telecommunications central office switching equipment.

6. An adapter for connecting leads of an ammeter to a fuse socket, comprising:
   a) an adapter shell shaped to fit within a fuse socket;
   b) first and second conductive means for contacting with first and second leads on an inner surface of the fuse socket, respectively; and
   c) first and second connecting means extending from an inner surface of the adapter shell for connecting the conductive means to leads of an ammeter.

7. The adapter of claim 6, wherein the first and second conductive means are located on an outer surface of the adapter shell.

8. The adapter of claim 6, wherein the first and second conductive means are located on an inner surface of the adapter shell.

9. An adapter for connecting leads of an ammeter to a fuse socket, comprising:
   a) an adapter shell shaped to fit within a fuse socket;
   b) first and second conductive means for contacting with first and second leads on an inner surface of the fuse socket, and for connecting the adapter from an inner surface of the adapter shell to leads of an ammeter.

10. A fuse adapter for use in testing an amount of current that is drawn across a fuse socket in an electrical circuit, wherein the fuse adapter is shaped to fit within a fuse socket and includes, on an outer surface of a shell of the adapter, first and second conductors for connecting to contacts within the fuse socket and first and second connecting wires extending from an inner surface of the shell of the adapter to connect to an ammeter, and wherein the adapter is utilized to test current through a circuit by performing the steps of:
    a) detecting that an electrical circuit is disconnected at a fuse;
    b) disconnecting the fuse from the fuse socket;
    c) connecting the fuse adapter to the fuse socket; and
    d) connecting the ammeter to the connecting wires, wherein the amount of current drawn through the circuit is indicated by the ammeter.

11. A fuse adapter used for testing an amount of current that is drawn across a fuse socket in an electrical circuit, wherein the fuse adapter is shaped to fit within a fuse socket and includes first and second conductors for connecting to contacts within the fuse socket and first and second connecting wires extending from the adapter to connect to an ammeter, and wherein the adapter is constructed by:
    a) identifying a type of fuse specifically designed for use in the fuse socket;
    b) removing a filament from between two contacts within the fuse; and
    c) connecting wires to each contact within the fuse and extending the wires from the fuse to be connected to leads of an ammeter.

* * * * *